United States Patent
Cowles et al.

(10) Patent No.: US 10,043,556 B2
(45) Date of Patent: Aug. 7, 2018

(54) DATA SHIFTING

(71) Applicant: Micron Technology, Inc., Boise, ID (US)

(72) Inventors: Timothy B. Cowles, Boise, ID (US); Steven M. Bodily, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/823,013

(22) Filed: Nov. 27, 2017

(65) Prior Publication Data

US 2018/0082719 A1  Mar. 22, 2018

Related U.S. Application Data

(63) Continuation of application No. 15/251,770, filed on Aug. 30, 2016, now Pat. No. 9,830,955, which is a
(Continued)

(51) Int. Cl.
*G11C 7/10* (2006.01)
*G11C 7/06* (2006.01)
(Continued)

(52) U.S. Cl.
CPC .............. *G11C 7/065* (2013.01); *G11C 5/06* (2013.01); *G11C 7/06* (2013.01); *G11C 7/08* (2013.01);
(Continued)

(58) Field of Classification Search
CPC .................................................. G11C 7/1006
(Continued)

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
(Continued)

*Primary Examiner* — Son Mai
(74) *Attorney, Agent, or Firm* — Brooks, Cameron & Huebsch, PLLC

(57) ABSTRACT

The present disclosure includes apparatuses and methods related to data shifting. An example apparatus comprises a first memory cell coupled to a first sense line of an array, a first isolation device located between the first memory cell and first sensing circuitry corresponding thereto, and a second isolation device located between the first memory cell and second sensing circuitry corresponding to a second sense line. The first and the second isolation devices are operated to shift data in the array without transferring the data via an input/output line of the array.

20 Claims, 5 Drawing Sheets

Related U.S. Application Data continuation of application No. 14/660,219, filed on Mar. 17, 2015, now Pat. No. 9,437,256, which is a continuation of application No. 14/031,432, filed on Sep. 19, 2013, now Pat. No. 9,019,785.

(51) Int. Cl.
| | | |
|---|---|---|
| *G11C 8/10* | (2006.01) | |
| *G11C 19/00* | (2006.01) | |
| *G11C 7/08* | (2006.01) | |
| *G11C 11/4091* | (2006.01) | |
| *G11C 5/06* | (2006.01) | |
| *G11C 7/22* | (2006.01) | |

(52) U.S. Cl.
CPC .......... *G11C 7/1006* (2013.01); *G11C 7/1036* (2013.01); *G11C 7/22* (2013.01); *G11C 8/10* (2013.01); *G11C 11/4091* (2013.01); *G11C 19/00* (2013.01); *G11C 2207/002* (2013.01); *G11C 2207/005* (2013.01)

(58) Field of Classification Search
USPC .................................................... 365/189.17
See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,042,012 A | 8/1991 | Foss |
| 5,201,039 A | 4/1993 | Sakamura |
| 5,210,850 A | 5/1993 | Kelly et al. |
| 5,253,308 A | 10/1993 | Johnson |
| 5,276,643 A * | 1/1994 | Hoffmann ............ G11C 7/1006 365/189.05 |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,835,436 A * | 11/1998 | Ooishi ................... G11C 7/10 365/222 |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A * | 6/1999 | Wendell ................ G11C 7/06 365/201 |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A * | 11/2000 | Fujino ................. G11C 11/401 365/149 |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 * | 1/2003 | Taylor .................... G11C 8/16 365/189.04 |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,457,188 B2 * | 11/2008 | Lee ..................... G11C 7/1006 365/189.011 |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |

(56) References Cited

U.S. PATENT DOCUMENTS

| | | |
|---|---|---|
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0329019 A1 | 12/2010 | Mukunoki |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | S6364692 | 3/1988 |
| JP | H07254277 | 10/1995 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |

(56) References Cited

FOREIGN PATENT DOCUMENTS

| WO | 2013062596 | 5/2013 |
|---|---|---|
| WO | 2013081588 | 6/2013 |
| WO | 2013095592 | 6/2013 |

OTHER PUBLICATIONS

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Supplementary European Search Report for related EP Patent Application No. 14846610.5, dated Jul. 13, 2017, 8 pages.
Machine Translation of Japan Patent Application No. H07254277 filed Oct. 3, 1995, as provided with the Supplementary European Search Report, 22 pages.
Office Action for related Japan Patent Application No. 2016-524080, dated Sep. 20, 2016, 9 pages.
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

\* cited by examiner

DATA SHIFTING

PRIORITY INFORMATION

This application is a Continuation of U.S. application Ser. No. 15/251,770, filed Aug. 30, 2016, which issues as U.S. Pat. No. 9,830,955 on Nov. 28, 2017, which is a Continuation of U.S. application Ser. No. 14/660,219, filed Mar. 17, 2015, which issued as U.S. Pat. No. 9,437,256 on Sep. 6, 2016, which is a Continuation of U.S. application Ser. No. 14/031,432, filed Sep. 19, 2013, which issued as U.S. Pat. No. 9,019,785 on Apr. 28, 2015, the contents of which are included herein by reference.

TECHNICAL FIELD

The present disclosure relates generally to semiconductor memory and methods, and more particularly, to apparatuses and methods related to performing data shifting.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR logical operations on data (e.g., one or more operands). For example, the functional unit circuitry may be used to perform arithmetic operations such as addition, subtraction, multiplication, and/or division on operands.

A number of components in an electronic system may be involved in providing instructions to the functional unit circuitry for execution. The instructions may be generated, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry) may be external to the memory array, and data is accessed via a bus between the processing resources and the memory array to execute a set of instructions. Typically, the memory array itself has limited capability and function. For instance, most memory arrays store the instructions to be executed and/or data to be operated on. Such memory arrays can include circuitry used for sensing memory cells and/or refreshing data stored therein.

DETAILED DESCRIPTION

Figure 1:
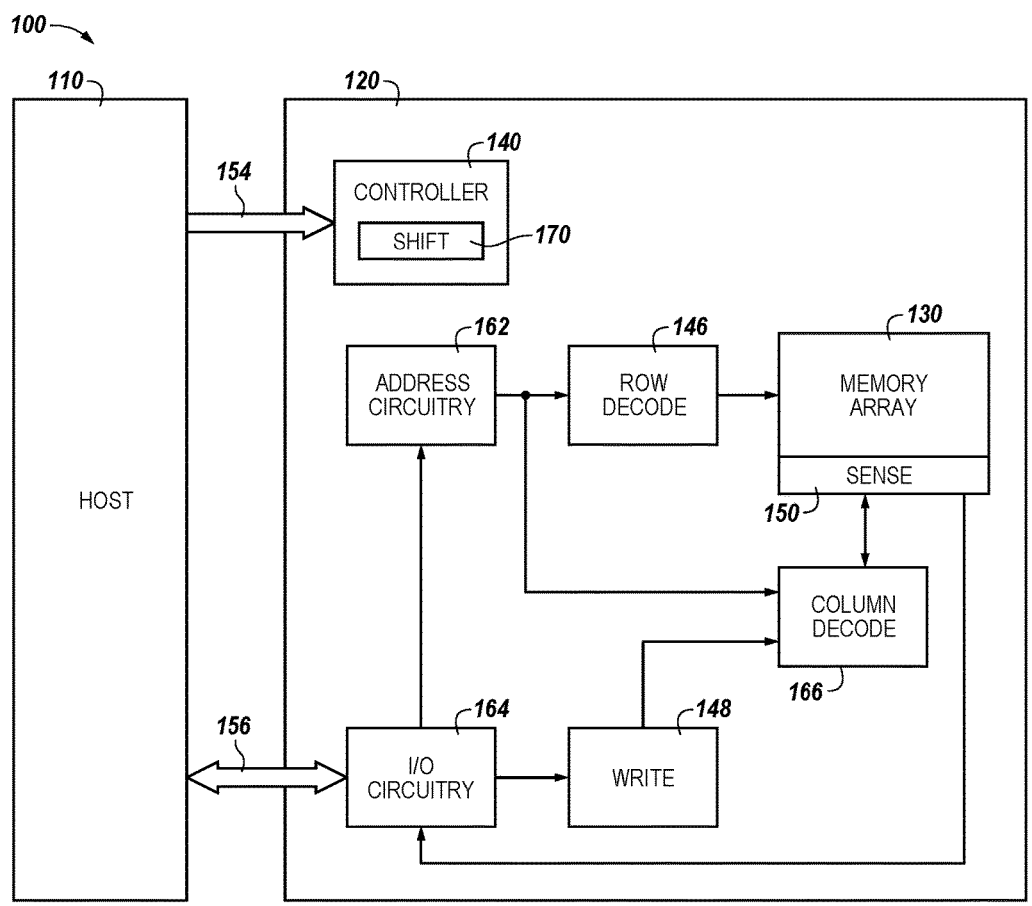
FIG. 1 is a block diagram of an apparatus in the form of a computing system including a memory device in accordance with a number of embodiments of the present disclosure.

The present disclosure includes apparatuses and methods related to data shifting. An example apparatus comprises a first memory cell coupled to a first sense line of an array, a first isolation device located between the first memory cell and first sensing circuitry corresponding thereto, and a second isolation device located between the first memory cell and second sensing circuitry corresponding to a second sense line. The first and the second isolation devices are operated to shift data in the array without transferring the data via an input/output line of the array.

A number of embodiments of the present disclosure can provide improved functionality associated with a memory array by providing the ability to shift data within the array (e.g., from one memory cell to another memory cell) without transferring data (e.g., to an external processing resource) via input/output lines (e.g., local and/or global input/output lines) of the array. As an example, embodiments of the present disclosure can provide for shifting data in an array (e.g., along a selected access line) such that data stored in a particular memory cell can be transferred (e.g., right or left) to an adjacent memory cell coupled to the selected access line, and the data value stored in the particular memory cell can be replaced with a data value shifted from a different memory cell. Shifting data within an array in accordance with embodiments described herein can be useful for a variety of processing tasks and can provide significant time savings as compared to previous data shifting approaches in which data may be transferred out of the array, shifted, and then transferred back into the array, for instance.

In previous approaches, performing data shifting may have included transferring data from the array and sensing circuitry (e.g., via a bus comprising input/output (I/O) lines)

to a processing resource such as a processor, microprocessor, and/or compute engine, which may comprise ALU circuitry and/or other functional unit circuitry configured to perform the appropriate shifting (e.g., in association with various logical operations). However, transferring data from a memory array and sensing circuitry to such processing resource(s) can involve significant power consumption. Even if the processing resource is located on a same chip as the memory array, significant power can be consumed in moving data out of the array to the processing resource, which can involve performing a sense line address access (e.g., firing of a column decode signal) in order to transfer data from sense lines onto I/O lines (e.g., local I/O lines), moving the data to the array periphery, and providing the data to the processing resource.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous systems may not be capable of being formed on pitch with the memory cells, which can affect chip size and/or memory density, for example. A number of embodiments of the present disclosure include isolation devices and related sensing circuitry formed on pitch with memory cells of the array and capable of being operated to perform data shifting as described further herein below. As used herein, an isolation device refers to a device, such as a transistor and/or diode, which is capable of selectively providing electrical isolation between at least a pair of nodes (e.g., terminals).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 204 may reference element "04" in FIG. 2, and a similar element may be referenced as 304 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks and/or sub-arrays of DRAM cells). An example DRAM array is described in association with FIGS. 2, 3, and 4.

The memory device 120 includes address circuitry 162 to latch address signals provided over an I/O bus 156 (e.g., a data bus) through I/O circuitry 164. Address signals are received and decoded by a row decoder 146 and a column decoder 166 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 164 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller comprising hardware, software, and/or firmware.

The controller 140 includes a shift controller 170 that can control signals provided to, for instance, isolation devices in association with performing data shifting as described further herein. For example, the shift controller 170 can control shifting data (e.g., right or left) in an array (e.g., along a selected access line of an array).

An example of the sensing circuitry 150 is described further below in association with FIGS. 2, 3, 4, and 5. For instance, in a number of embodiments, the sensing circuitry 150 can comprise a number of sense amplifiers (e.g., sense amplifiers 206 shown in FIG. 2, sense amplifiers 306 shown in FIG. 3, sense amplifier 406 shown in FIG. 4, or sense amplifier 506 shown in FIG. 5) and accumulator circuitry (e.g., accumulator circuitry 231 shown in FIG. 2, 331 shown in FIG. 3, and 431 shown in FIG. 4), which may comprise an accumulator and can be used to provide temporary storage of data values in association with data shifting as described further herein.

Figure 2:
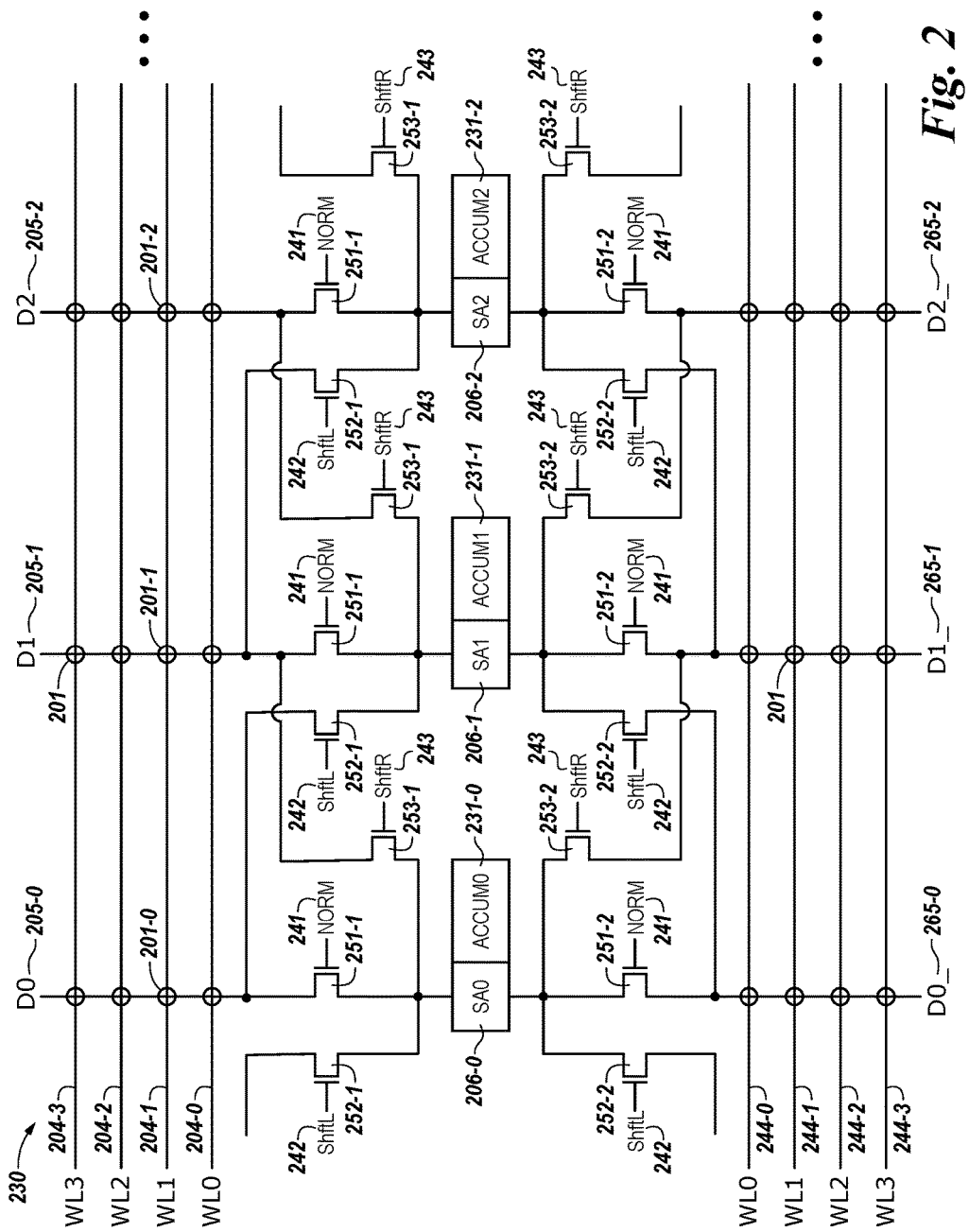
FIG. 2 illustrates a schematic diagram of a portion of a memory array configured to perform data shifting in accordance with a number of embodiments of the present disclosure.
Figure 3:
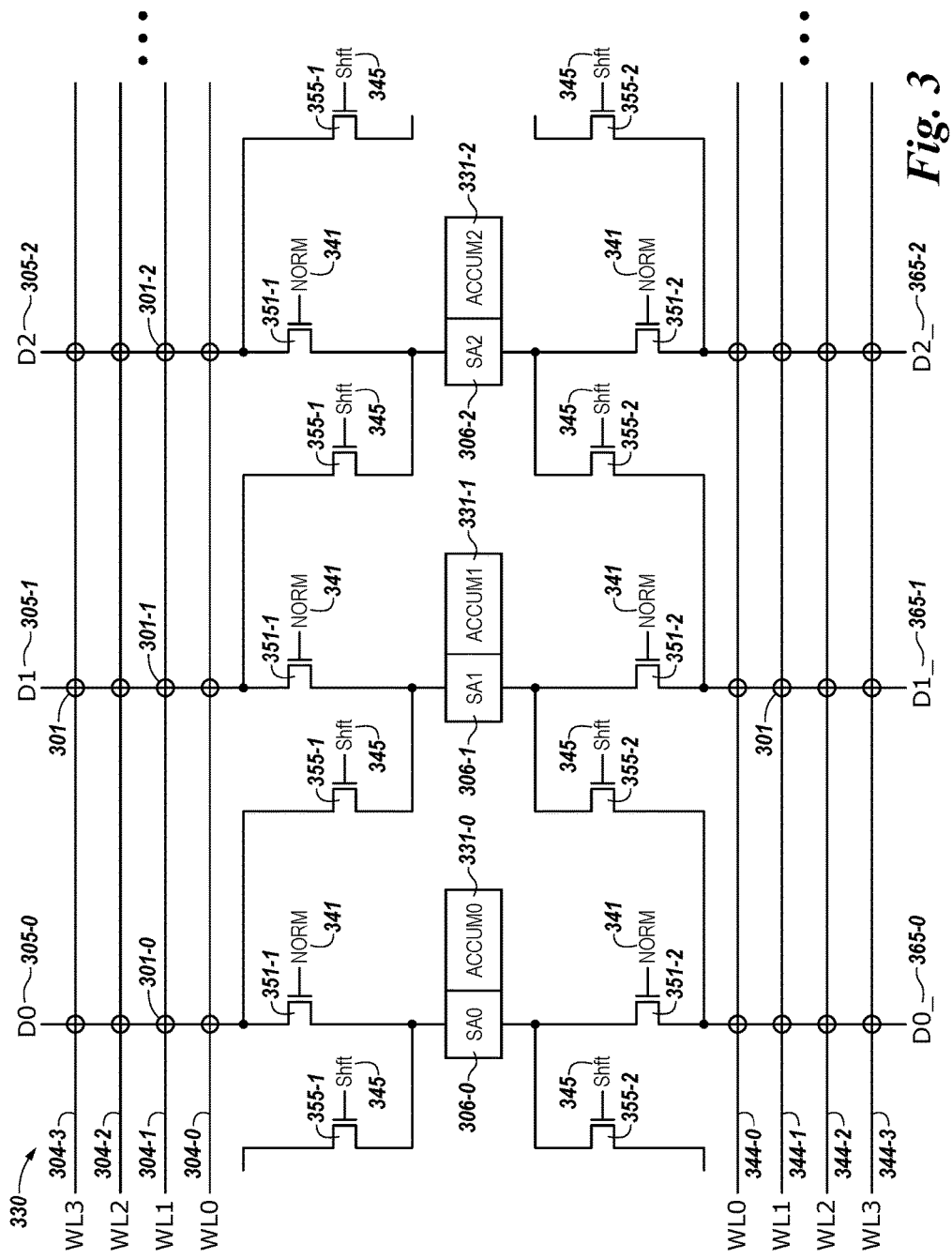
FIG. 3 illustrates a schematic diagram of a portion of a memory array configured to perform data shifting in accordance with a number of embodiments of the present disclosure.

FIG. 2 illustrates a schematic diagram of a portion of a memory array 230 configured to perform data shifting in accordance with a number of embodiments of the present disclosure. The array 230 includes a first portion (e.g., sub-array) comprising a number of access lines 204-0 (WL0), 204-1 (WL1), 204-2 (WL2), and 204-3 (WL3) and a number of sense lines 205-0 (D0), 205-1 (D1), and 205-2 (D2). The array 230 also includes a second portion comprising a number of access lines 244-0 (WL0), 244-1 (WL1), 244-2 (WL2), and 244-3 (WL3) and a number of sense lines 265-0 (D0_), 265-1 (D1_), and 265-2 (D2_), which serve as complementary sense lines to sense lines 205-0, 205-1, and 205-2, respectively. As such, the cells 201 of array 230 are arranged in rows coupled by the access lines (e.g., word lines) and columns coupled by the sense lines (e.g., digit lines), with each column of cells 201 being associated with a pair of complementary sense lines. Embodiments are not limited to the number of columns shown in FIG. 2.

Figure 4:
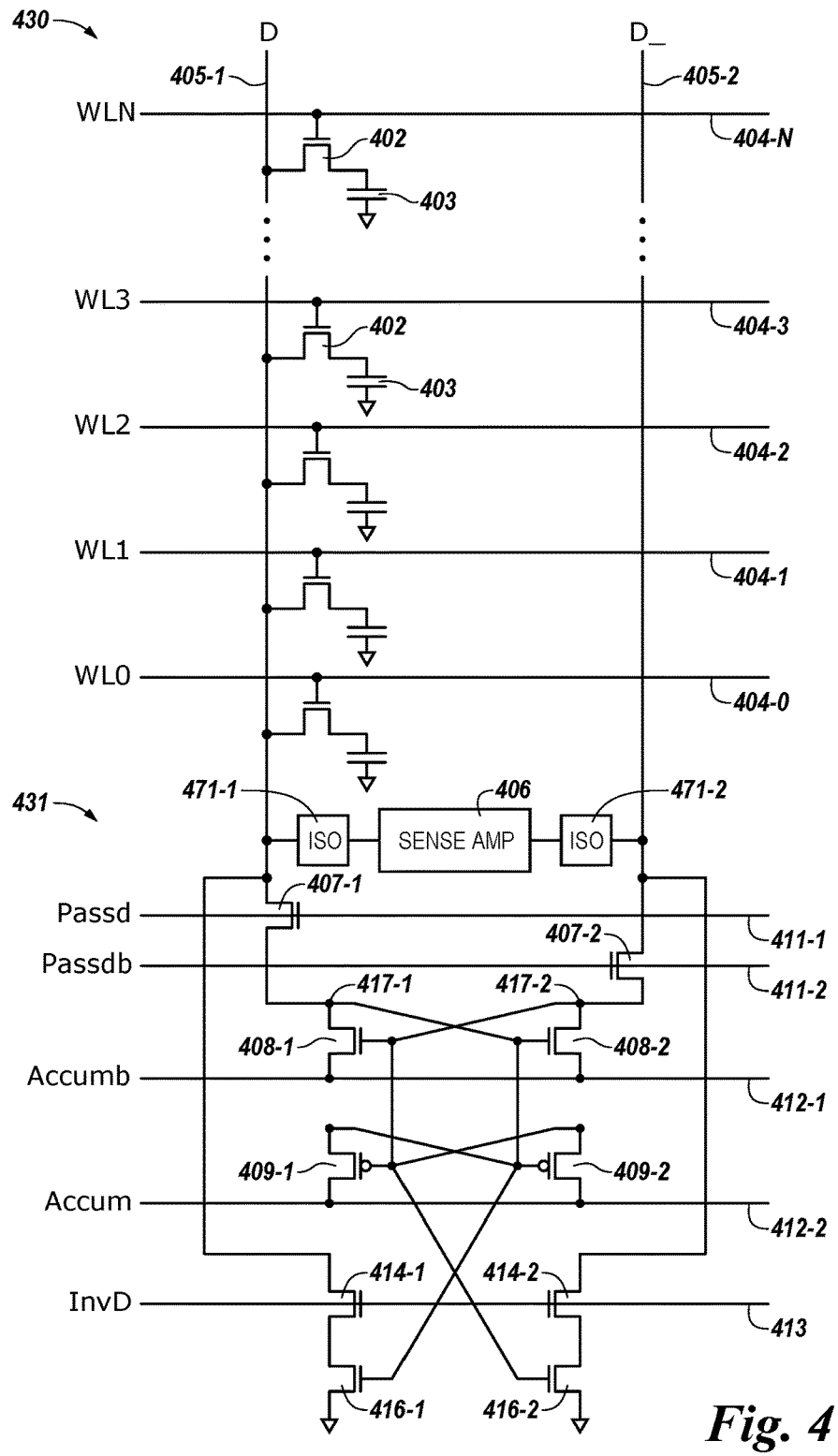
FIG. 4 illustrates a schematic diagram of a portion of a memory array configured to perform data shifting in accordance with a number of embodiments of the present disclosure.

The array 230 can be, for example, a DRAM array of 1T1C (one transistor one capacitor) memory cells each comprised of an access device 202 and a storage element (e.g., transistor 402 and capacitor 403, as shown in FIG. 4). In a number of embodiments, the memory cells 201 are destructive read memory cells (e.g., reading the data stored in the cell destroys the data such that the data originally stored in the cell is refreshed after being read).

The array 230 is coupled to sensing circuitry in accordance with a number of embodiments of the present disclosure. In this example, each pair of complementary sense lines is coupled to sensing circuitry comprising a sense amplifier (referred to generally as 206) and an accumulator (referred to generally as 231). For instance, sense lines 205-0/265-0 are coupled to sense amplifier 206-0 (SA0) and corresponding accumulator 231-0 (ACCUM0), sense lines 205-1/265-1 are coupled to sense amplifier 206-1 (SA1) and corresponding accumulator 231-1 (ACCUM1), and sense lines 205-2/265-2 are coupled to sense amplifier 206-2 (SA2) and corresponding accumulator 231-2 (ACCUM2). An example sense amplifier is described in association with FIG. 5, and an example accumulator is described in association with FIG. 4. Although an open digit line architecture is illustrated in FIG. 2, embodiments are not so limited. For instance, the array 230 can have a folded digit line architecture such as that shown in FIG. 4, among other digit line architectures.

The sense amps 206 can be operated to determine data (e.g., logic data value) stored in a selected cell via a sensing (e.g. read) operation. The accumulators 231 can be operated to store (e.g., temporarily) data read from memory cells in association with data shifting in accordance with embodiments described herein. As described further below, the sensing circuitry coupled to a particular digit line can be operated to sense and/or store a data value from a memory cell coupled to the particular digit line or from a memory cell coupled to a different digit line (e.g., an adjacent digit line). Embodiments are not limited to the example sensing circuitry shown in FIG. 2. For instance, sensing circuitry in accordance with a number of embodiments described herein can include current-mode sense amplifiers and/or single-ended sense amplifiers (e.g., sense amplifiers coupled to one sense line).

A number of embodiments of the present disclosure include a number of isolation devices that can be operated in association with shifting data in an array (e.g., along a selected access line of an array such as array 230). The isolation devices can be located between the sensing circuitry corresponding to the particular digit lines and the memory cells coupled to the digit lines. For instance, in the example shown in FIG. 2 each of the digit lines 205-0, 205-1, and 205-2 include three isolation devices 251-1, 252-1, and 253-1 located between their respective sensing circuitry and the memory cells 201. Similarly, each of the complementary digits lines 265-0, 265-1, and 265-2 include three isolation devices 251-2, 252-2, and 253-2 located between their respective sensing circuitry and the memory cells 201.

For instance, with reference to digit line 205-1, an isolation device 251-1 is located between sense amplifier 206-1 and the memory cells coupled to digit line 205-1, an isolation device 252-1 is located between sense amplifier 206-1 and the memory cells coupled to adjacent digit line 205-0, and an isolation device 253-1 is located between sense amplifier 206-1 and the memory cells coupled to adjacent digit line 205-2. Similarly, with reference to complementary digit line 265-1, an isolation device 251-2 is located between sense amplifier 206-1 and the memory cells coupled to digit line 265-1, an isolation device 252-2 is located between sense amplifier 206-1 and the memory cells coupled to adjacent digit line 265-0, and an isolation device 253-2 is located between sense amplifier 206-1 and the memory cells coupled to adjacent digit line 265-2.

In the example shown in FIG. 2, the isolation devices 251-1, 252-1, 253-1, 251-2, 252-2, and 253-2 are n-channel (Nch) transistors (e.g., field-effect transistors); however, embodiments are not limited to a particular type transistor or other isolation device. In the example shown in FIG. 2 and with reference again to digit line 205-1, a first terminal (e.g., source/drain) of the isolation device 251-1 corresponding to digit line 205-1, a first terminal of isolation device 252-1 corresponding to digit line 205-2, and a first terminal of isolation device 253-1 corresponding to digit line 205-0 are coupled to each other and to digit line 205-1. A second terminal of isolation device 252-1 corresponding to digit line 205-2 is coupled to sense amplifier 206-2, and a second terminal of isolation device 253-1 corresponding to digit line 205-0 is coupled to sense amplifier 206-0. Also, a second terminal of isolation device 251-1 corresponding to digit line 205-1, a first terminal of isolation device 252-1 corresponding to digit line 205-1, and a first terminal of isolation device 253-1 corresponding to digit line 205-1 are coupled to each other and to sense amplifier 206-1.

In a number of embodiments, the isolation devices 251-1, 252-1, 253-1, 251-2, 252-2, and 253-2 can be formed on pitch with the memory cells 201 and/or the sensing circuitry (e.g., sense amplifiers 206 and/or accumulators 231) of array 230, which may conform to a particular feature size (e.g., $4F^2$, $6F^2$, etc.). The isolation devices 251-1, 252-1, 253-1, 251-2, 252-2, and 253-2 can be formed in a gap between sense amplifiers 206, which can, as compared to previous approaches, reduce the amount of space needed for such devices and/or increase the amount of space available for other circuitry. As such, apparatuses and methods for shifting data in accordance with embodiments described herein have benefits over previous approaches.

In operation, signals can be selectively provided (e.g., via shift controller 170 shown in FIG. 1) to the gates of the isolation devices 251-1, 252-1, 253-1, 251-2, 252-2, and 253-2 in order to shift data within the array (e.g., along a selected access line of the array 230). In the example shown in FIG. 2, the isolation devices 251-1 and 251-2 are enabled/disabled via a signal 241 (NORM), the isolation devices 252-1 and 252-1 are enabled/disabled via a signal 242 (ShftL), and the isolation devices 253-1 and 253-2 are enabled/disabled via a signal 243 (ShftR).

Data can be shifted to the right or to the left (e.g., along a selected access line) in accordance with a number of embodiments. For example, an operation to shift a data value stored in memory cell 201-1 to the right (e.g., to memory cell 201-2) along selected access line 204-1 can include enabling (e.g., turning on via "NORM" control signal 241) isolation device 251-1 corresponding to digit line 205-1 while disabling (via the "ShftR" and "ShftL" control signals) the isolation devices 252-1 and 253-1. With isolation device 251-1 enabled, a sensing (e.g., reading) operation can be performed to determine a data value stored in memory cell 201-1 (e.g., by activating the selected access line 204-1 and sense amplifier 206-1). The sensed data value can be stored in accumulator 231-1. The sensed data value can then be shifted to cell 201-2 by enabling (e.g., via "ShftR" control signal 243) the isolation device 253-1 corresponding to digit line 205-1 and activating the selected access line 204-1. As such, activating access line 204-1 while isolation device 253-1 is enabled writes the data value stored in accumulator 231-1 to memory cell 201-2. Therefore, the data value stored in cell 201-1 is shifted to cell 201-2 without transferring the data out of the array via I/O lines and/or via a sense line address access (e.g., without firing a column decode signal such that data is transferred to circuitry external from the array and sensing circuitry via local I/O lines). It is also noted that the data value from cell 201-1 that is sensed by the sensing circuitry corresponding to digit line 205-1 is transferred to cell 201-2 without being transferred to and/or sensed by the sensing circuitry corresponding to digit line 205-2. As such, the data value can be shifted via execution of a single (e.g., only one) sensing operation.

In a similar fashion, an operation to shift a data value stored in memory cell 201-1 to the left (e.g., to memory cell 201-0) along selected access line 204-1 can include enabling (e.g., turning on via "NORM" control signal 241) isolation device 251-1 corresponding to digit line 205-1 while disabling (via the "ShftR" and "ShftL" control signals) the isolation devices 252-1 and 253-1. With isolation device 251-1 enabled, a sensing (e.g., reading) operation can be performed to determine a data value stored in memory cell 201-1 (e.g., by activating the selected access line 204-1 and sense amplifier 206-1). The sensed data value can be shifted to cell 201-0 by enabling (e.g., turning on) the isolation device 252-1 corresponding to digit line 205-1 (e.g., via "ShftL" control signal 242) and activating the selected access line 204-1. As such, activating access line 204-1 while isolation device 252-1 is enabled writes the data value stored in accumulator 231-1 to memory cell 201-0.

Although the example above focuses on shifting data from a single memory cell (e.g., 201-1), the isolation devices 251-1, 252-1, and 253-1 and 251-2, 252-2, and 253-2 can be operated to shift data from multiple cells simultaneously. For instance, data from all of the cells coupled to a selected access line (e.g., a page of data) can be shifted to the right (e.g., via enabling isolation devices 253-1/253-2) or to the left (e.g., via enabling isolation devices 252-1/252-2). Also, data stored in cells coupled to digit lines 265-0, 265-1, and 265-2 can be shifted along access lines 244-0 to 244-3 in a similar manner as described above. Although not illustrated in FIG. 2, in a number of embodiments, isolation devices may be coupled between non-adjacent digit lines such that data can be shifted to non-adjacent memory cells. For instance, a data value stored in memory cell 201-0 may be transferred directly to memory cell 201-2. Moreover, in a number of embodiments, data from a particular memory cell (e.g., 201-0) may be transferred to more than one memory cell.

FIG. 3 illustrates a schematic diagram of a portion of a memory array 330 configured to perform data shifting in accordance with a number of embodiments of the present disclosure. The array 330 includes a first portion (e.g., sub-array) comprising a number of access lines 304-0 (WL0), 304-1 (WL1), 304-2 (WL2), and 304-3 (WL3) and a number of sense lines 305-0 (D0), 305-1 (D1), and 305-2 (D2). The array 330 also includes a second portion comprising a number of access lines 344-0 (WL0), 344-1 (WL1), 344-2 (WL2), and 344-3 (WL3) and a number of sense lines 365-0 (D0_), 365-1 (D1_), and 365-2 (D2_), which serve as complementary sense lines to sense lines 305-0, 305-1, and 305-2, respectively. As such, the cells 301 of array 330 are arranged in rows coupled by the access lines (e.g., word lines) and columns coupled by the sense lines (e.g., digit lines), with each column of cells 301 being associated with a pair of complementary sense lines. Embodiments are not limited to the number of columns shown in FIG. 3.

The array 330 can be, for example, a DRAM array of 1T1C (one transistor one capacitor) memory cells each comprised of an access device and a storage element (e.g., transistor 402 and capacitor 403, as shown in FIG. 4). In a number of embodiments, the memory cells 301 are destructive read memory cells (e.g., reading the data stored in the cell destroys the data such that the data originally stored in the cell is refreshed after being read).

The array 330 is coupled to sensing circuitry in accordance with a number of embodiments of the present disclosure. In this example, each pair of complementary sense lines is coupled to sensing circuitry comprising a sense amplifier (referred to generally as 306) and an accumulator (referred to generally as 331). For instance, sense lines 305-0/365-0 are coupled to sense amplifier 306-0 (SA0) and corresponding accumulator 331-0 (ACCUM0), sense lines 305-1/365-1 are coupled to sense amplifier 306-1 (SA1) and corresponding accumulator 331-1 (ACCUM1), and sense lines 305-3/365-2 are coupled to sense amplifier 306-2 (SA2) and corresponding accumulator 331-2 (ACCUM2). An example sense amplifier is described in association with FIG. 5, and an example accumulator is described in association with FIG. 4.

The sense amps 306 can be operated to determine data (e.g., logic data value) stored in a selected cell via a sensing (e.g. read) operation. The accumulators 331 can be operated to store (e.g., temporarily) data read from memory cells in association with data shifting in accordance with embodiments described herein. As described further below, the sensing circuitry coupled to a particular digit line can be operated to sense and/or store a data value from a memory cell coupled to the particular digit line or from a memory cell coupled to a different digit line (e.g., an adjacent digit line). Embodiments are not limited to the example sensing circuitry shown in FIG. 3.

The array 330 includes isolation devices located between the sensing circuitry corresponding to the particular digit lines and the memory cells coupled to the digit lines. For instance, in the example shown in FIG. 3 each of the digit lines 305-0, 305-1, and 305-2 include a first isolation device 351-1 located between their respective sensing circuitry and the corresponding memory cells 301 and a second isolation device 355-1 located between their respective memory cells 301 and the sensing circuitry corresponding to an adjacent digit line. For instance, isolation device 355-1 corresponding to digit line 305-0 is located between the memory cells of digit line 305-0 and the sensing circuitry corresponding to digit line 305-1, isolation device 355-1 corresponding to digit line 305-1 is located between the memory cells of digit line 305-1 and the sensing circuitry corresponding to digit line 305-2, and, although not shown in FIG. 3, the isolation device 355-1 corresponding to digit line 305-2 is located between the memory cells of digit line 305-2 and the sensing circuitry corresponding to the next adjacent digit line. Similarly, each of the complementary digits lines 365-0, 365-1, and 365-2 include a first isolation device 351-1 located between their respective sensing circuitry and the corresponding memory cells 301 and a second isolation device 355-1 located between their respective memory cells 301 and the sensing circuitry corresponding to an adjacent digit line.

As an example, with reference to digit line 305-1, an isolation device 351-1 is located between sense amplifier 306-1 and the memory cells coupled to digit line 305-1 and an isolation device 355-1 is located between sense amplifier 306-1 and the memory cells coupled to adjacent digit line 305-0. Similarly, with reference to complementary digit line 365-1, an isolation device 351-2 is located between sense amplifier 306-1 and the memory cells coupled to digit line 365-1 and an isolation device 355-2 is located between sense amplifier 306-1 and the memory cells coupled to adjacent digit line 365-0.

In the example shown in FIG. 3, the isolation devices 351-1, 355-1, 351-2, and 355-2 are n-channel (Nch) transistors (e.g., field-effect transistors); however, embodiments are not limited to a particular type transistor or other isolation device. In the example shown in FIG. 3 and with reference again to digit line 305-1, a first terminal (e.g., source/drain) of the isolation device 351-1 corresponding to digit line 305-1 and a first terminal of isolation device 355-1 corresponding to digit line 305-1 are coupled to each other and to sense amplifier 306-1. A second terminal of isolation device 355-1 corresponding to digit line 305-1 and a first terminal of isolation device 351-1 corresponding to digit line 305-0 are coupled to each other and to digit line 305-0, with a second terminal of the isolation device 351-1 corresponding to digit line 305-0 being coupled to sense amplifier 306-0. A second terminal of isolation device 351-1 corresponding to digit line 305-1 and a first terminal of isolation device 355-1 corresponding to digit line 305-2 are coupled to each other and to digit line 305-1. Also, a second terminal of the isolation device 355-1 corresponding to digit line 305-2 and a first terminal of isolation device 351-1 corresponding to digit line 305-2 are coupled to each other and to sense amplifier 306-2, with a second terminal of the isolation device 351-1 corresponding to digit line 305-2 being coupled to isolation device 355-1 corresponding to a next adjacent digit line (not shown) and to digit line 305-2.

In a number of embodiments, the isolation devices 351-1, 355-1, 351-2, and 355-2 can be formed on pitch with the memory cells 301 and/or the sensing circuitry (e.g., sense amplifiers 306 and/or accumulators 331) of array 330, which may conform to a particular feature size (e.g., $4F^2$, $6F^2$, etc.).

In operation, signals can be selectively provided (e.g., via shift controller 170 shown in FIG. 1) to the gates of the isolation devices 351-1, 355-1, 351-2, and 355-2 in order to shift data within the array (e.g., along a selected access line of the array 330). In the example shown in FIG. 3, the isolation devices 351-1 and 351-2 are enabled/disabled via a signal 341 (NORM), and the isolation devices 355-1 and 355-1 are enabled/disabled via a signal 345 (Shft).

Data can be shifted to the right or to the left (e.g., along a selected access line) in accordance with a number of embodiments. For example, an operation to shift a data value stored in memory cell 301-1 to the left (e.g., to memory cell 301-0) along selected access line 304-1 can include enabling (e.g., via "NORM" control signal 341) isolation device 351-1 corresponding to digit line 305-1 while disabling (via the "Shft" control signal) the isolation devices 355-1. With isolation device 351-1 enabled, a sensing (e.g., reading) operation can be performed to determine a data value stored in memory cell 301-1 (e.g., by activating the selected access line 304-1 and sense amplifier 306-1). The sensed data value can be stored in accumulator 331-1. The sensed data value can then be shifted to cell 301-0 by enabling (e.g., via "Shft" control signal 345) the isolation device 355-1 corresponding to digit line 305-1 and activating the selected access line 304-1. As such, activating access line 304-1 while isolation device 355-1 is enabled writes the data value stored in accumulator 331-1 to memory cell 301-0. Therefore, the data value stored in cell 301-1 is shifted to cell 301-0 without transferring the data out of the array via I/O lines and/or via a sense line address access (e.g., without firing a column decode signal such that data is transferred to circuitry external from the array and sensing circuitry via local I/O lines). It is also noted that the data value from cell 301-1 that is sensed by the sensing circuitry corresponding to digit line 305-1 is transferred to cell 301-0 without being transferred to and/or sensed by the sensing circuitry corresponding to digit line 305-0. As such, the data value can be shifted (e.g., to the left) via execution of a single (e.g., only one) sensing operation.

An operation to shift a data value stored in memory cell 301-1 to the right (e.g., to memory cell 301-2) along selected access line 304-1 can include enabling (e.g., via "Shft" control signal 345) isolation device 355-1 corresponding to digit line 305-2, disabling (via "NORM" control signal 341) the isolation device 351-1 corresponding to digit line 305-1, and sensing (e.g., reading) the data value stored in memory cell 301-1 (e.g., by activating the selected access line 304-1 and sense amplifier 306-2). The data value sensed by sense amplifier 306-2 can be stored in accumulator 331-2. As such, the data value stored in cell 301-1 is shifted to the sensing circuitry (e.g., accumulator 331-2) corresponding to digit line 305-2. The sensed data value can then be written from the accumulator 331-2 to memory cell 301-2 by enabling (e.g., via "NORM" control signal 341) the isolation device 351-1 corresponding to digit line 305-2 and activating the selected access line 304-1. That is, activating access line 304-1 while the isolation device 351-1 corresponding to digit line 305-2 is enabled writes the data value stored in accumulator 331-2 to memory cell 301-2.

Although the example above focuses on shifting data from a single memory cell (e.g., 301-1), the isolation devices 351-1, 355-1, 351-2, and 355-2 can be operated to shift data from multiple cells simultaneously. For instance, data from all of the cells coupled to a selected access line (e.g., a page of data) can be shifted to the left by enabling isolation devices 351-1 to read the data values stored in memory cells of particular digit lines into the respective sensing circuitry corresponding thereto and then enabling the isolation devices 355-1 to write the data values from the respective sensing circuitry to adjacent memory cells by activating the selected access line while the isolation devices 355-1 are enabled. A page of data can be shifted to the right, for example, by enabling the isolation devices 355-1 and reading the data value stored in memory cells of particular digit lines into sensing circuitry corresponding to digit lines adjacent to the particular digit lines. The isolation devices 351-1 can then be enabled to write the data values from the sensing circuitry to the memory cells corresponding thereto. Data stored in cells coupled to digit lines 365-0, 365-1 and 365-2 can be shifted along access lines 344-0 to 344-3 in a similar manner as described above.

FIG. 4 illustrates a schematic diagram of a portion of a memory array 430 configured to perform data shifting in accordance with a number of embodiments of the present disclosure. In this example, the memory array 430 is a DRAM array of 1T1C (one transistor one capacitor) memory cells each comprised of an access device 402 (e.g., transistor) and a storage element 403 (e.g., a capacitor). The cells of array 430 are arranged in rows coupled by word lines 404-0 (WL0), 404-1 (WL1), 404-2, (WL2) 404-3 (WL3), . . . , 404-N (WLN) and columns coupled by sense lines (e.g., digit lines) 405-1 (D) and 405-2 (D_). In this example, each column of cells is associated with a pair of complementary sense lines 405-1 (D) and 405-2 (D_). Although only a single column of memory cells is illustrated in FIG. 4, embodiments are not so limited. For instance, a particular array may have a number of columns of memory cells and/or sense lines (e.g., 4,096, 8,192, 16,384, etc.). A gate of a particular memory cell transistor 402 is coupled to its corresponding word line 404-0, 404-1, 404-2, 404-3, . . . , 404-N, a first source/drain region is coupled to its corresponding sense line 405-1, and a second source/drain region of a particular memory cell transistor is coupled to its corresponding capacitor 403. Although not illustrated in FIG. 4, the sense line 405-2 may also be coupled to a number of memory cells.

The array 430 is coupled to sensing circuitry in accordance with a number of embodiments of the present disclosure. In this example, the sensing circuitry comprises a sense amplifier 406 and an accumulator 431. The sensing circuitry can be sensing circuitry 150 shown in FIG. 1. The sense amplifier 406 is coupled to the complementary sense lines D/D_ corresponding to a particular column of memory cells. The sense amplifier 406 can be a sense amplifier such as sense amplifier 506 described below in association with FIG. 5. As such, the sense amp 406 can be operated to determine a data value stored in a selected cell. Embodiments are not limited to the example sense amplifier 406.

The example shown in FIG. 4 includes isolation circuitry 471-1 located between the sense amplifier 406 and the memory cells coupled to digit line 405-1 and isolation circuitry 471-2 located between sense amplifier 406 and memory cells (not shown) coupled to complementary sense line 405-2. The isolation circuitry 471-1 and/or 471-2 can comprise a number of isolation devices, such as a number of transistors as described in association with FIGS. 2 and 3.

In the example shown in FIG. 4, the accumulator 431 comprises a number of transistors formed on pitch with the transistors of the sense amp 406 and/or the memory cells of the array 430, which may conform to a particular feature size (e.g., $4F^2$, $6F^2$, etc.). The isolation devices of circuitry 471-1 and 471-2 can also be formed on pitch with the memory cells of array 430. The accumulator 431 can, in conjunction with the sense amp 406 and isolation circuitry 471-1/471-2, operate to perform data shifting in accordance with embodiments described herein.

In the example illustrated in FIG. 4, the circuitry corresponding to accumulator 431 comprises five transistors coupled to each of the sense lines D and D_; however, embodiments are not limited to this example. Transistors 407-1 and 407-2 have a first source/drain region coupled to sense lines D and D_, respectively, and a second source/drain region coupled to a cross coupled latch (e.g., coupled to gates of a pair of cross coupled transistors, such as cross coupled NMOS transistors 408-1 and 408-2 and cross coupled PMOS transistors 409-1 and 409-2). The cross coupled latch comprising transistors 408-1, 408-2, 409-1, and 409-2 can be used to temporarily store data values in association with data shifting as described herein.

The transistors 407-1 and 407-2 can be referred to as pass transistors, which can be enabled via respective signals 411-1 (Passd) and 411-2 (Passdb) in order to pass the voltages or currents on the respective sense lines D and D_ to the inputs of the cross coupled latch comprising transistors 408-1, 408-2, 409-1, and 409-2. In this example, the second source/drain region of transistor 407-1 is coupled to a first source/drain region of transistors 408-1 and 409-1 as well as to the gates of transistors 408-2 and 409-2. Similarly, the second source/drain region of transistor 407-2 is coupled to a first source/drain region of transistors 408-2 and 409-2 as well as to the gates of transistors 408-1 and 409-1.

A second source/drain region of transistor 408-1 and 408-2 is commonly coupled to a negative control signal 412-1 (Accumb). A second source/drain region of transistors 409-1 and 409-2 is commonly coupled to a positive control signal 412-2 (Accum). The Accum signal 412-2 can be a supply voltage (e.g., VDD) and the Accumb signal can be a reference voltage (e.g., ground). Enabling signals 412-1 and 412-2 activates the cross coupled latch comprising transistors 408-1, 408-2, 409-1, and 409-2. The activated sense amp pair operates to amplify a differential voltage between common node 417-1 and common node 417-2 such that node 417-1 is driven to one of the Accum signal voltage and the Accumb signal voltage (e.g., to one of VDD and ground), and node 417-2 is driven to the other of the Accum signal voltage and the Accumb signal voltage.

In this example, the accumulator 431 also includes inverting transistors 414-1 and 414-2 having a first source/drain region coupled to the respective digit lines D and D_. A second source/drain region of the transistors 414-1 and 414-2 is coupled to a first source/drain region of transistors 416-1 and 416-2, respectively. The gates of transistors 414-1 and 414-2 are coupled to a signal 413 (InvD). The gate of transistor 416-1 is coupled to the common node 417-1 to which the gate of transistor 408-2, the gate of transistor 409-2, and the first source/drain region of transistor 408-1 are also coupled. In a complementary fashion, the gate of transistor 416-2 is coupled to the common node 417-2 to which the gate of transistor 408-1, the gate of transistor 409-1, and the first source/drain region of transistor 408-2 are also coupled. As such, enabling signal InvD serves to invert the data value stored in the secondary latch and drives the inverted value onto sense lines 405-1 and 405-2.

The accumulator 431 shown in FIG. 4 can be operated (e.g., via the Passd, Passdb, Accumb, Accum, and InvD signals) to store data in association with data shifting as described above in association with FIGS. 2 and 3, for example. For instance, in operation, a data value stored in a memory cell can be sensed by activating an access line to which the cell is coupled. Activation of the selected access line enables the access transistor (e.g., 402) corresponding to the selected cell, resulting in coupling of the sense line D to the selected memory cell (e.g., to the capacitor 403 if the cell is a 1T1C DRAM cell), which creates a differential voltage signal between the sense lines D and D_. The sense amplifier 406 activates (e.g., via application of control signals such as signals PSA and RNL_ described in FIG. 5), which amplifies the differential signal between D and D_, resulting in a voltage (e.g., VDD) corresponding to a logic 1 or a voltage (e.g., ground) corresponding to a logic 0 being on sense line D (and the other voltage being on complementary sense line D_), such that the sensed data value is stored in the primary latch of sense amp 406.

The data value stored in sense amp 406 can be stored in the accumulator by enabling the pass transistors 407-1 and 407-2 (e.g., via respective Passd and Passdb control signals applied to control lines 411-1 and 411-2, respectively). The control signals 411-1 and 411-2 are referred to collectively as control signals 411. As used herein, various control signals, such as Passd and Passdb, may be referenced by referring to the control lines to which the signals are applied. For instance, a Passd signal can be referred to as control signal 411-1. With the pass transistors 407-1 and 407-2 enabled, the control signals Accumb and Accum are activated via respective control lines 412-1 and 412-2, which activates the latch of accumulator 431. As such, the sensed data value stored in sense amp 406 is transferred (e.g., copied) to the accumulator latch.

As described above in association with FIGS. 2 and 3, the particular memory cell to which a sense amplifier is coupled during a sensing operation can depend on which isolation devices of isolation circuitry 471-1/471-2 are enabled. For instance, a sense amplifier corresponding to a particular digit line may be coupled to a memory cell of an adjacent digit line via enabling of an isolation device such as isolation device 355-1 shown in FIG. 3 or isolation devices such as isolation devices 252-1 and 253-1 shown in FIG. 2.

Figure 5:
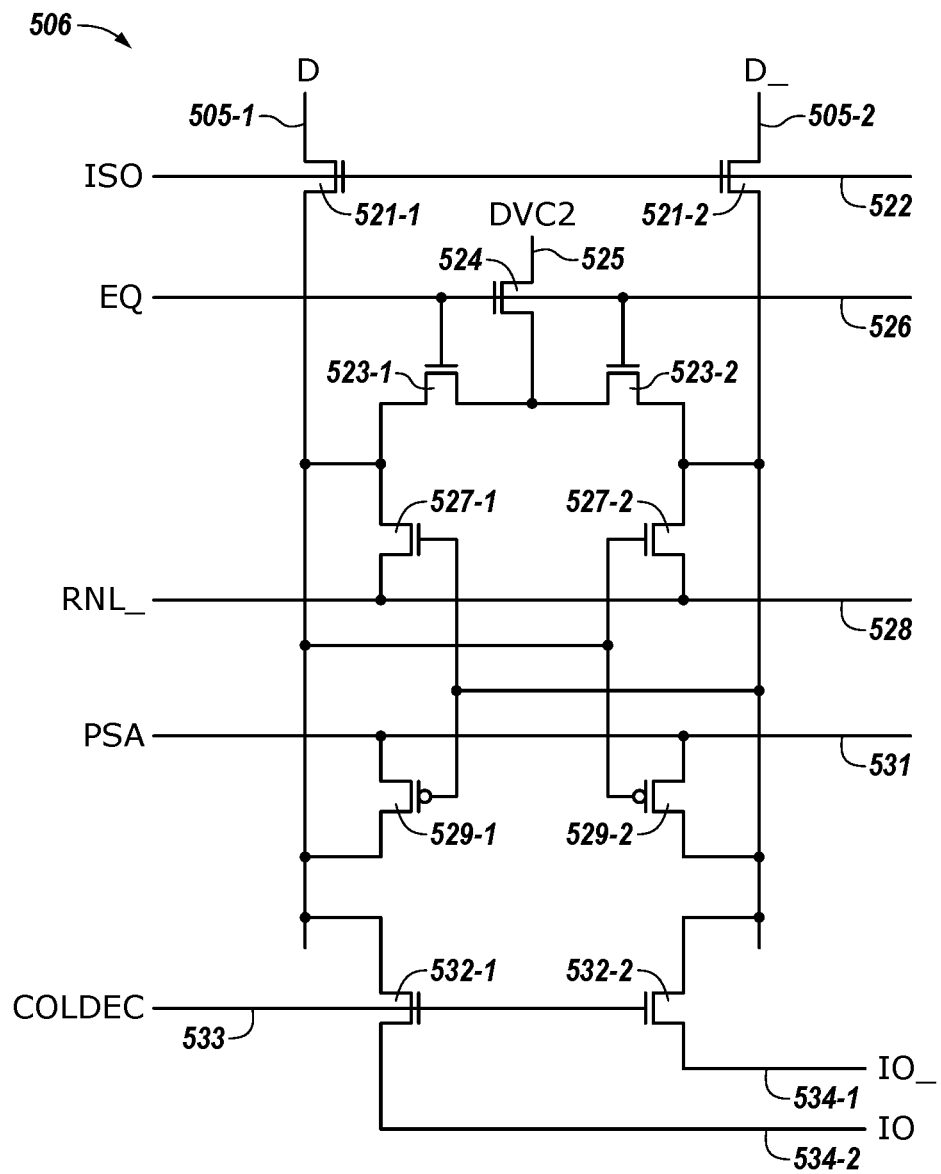
FIG. 5 illustrates a schematic diagram of a portion of sensing circuitry in accordance with a number of embodiments of the present disclosure.

FIG. 5 illustrates a schematic diagram of a portion of sensing circuitry in accordance with a number of embodiments of the present disclosure. In this example, the portion of sensing circuitry comprises a sense amplifier 506. In a number of embodiments, one sense amplifier 506 is provided for each column of memory cells in an array (e.g., array 130, 230, 330, 430). The sense amplifier 506 can be sense amplifier of a DRAM array, for instance. The sense amplifier 506 can be a sense amplifier such as sense amplifiers 206, 306, and 406 described above in association with FIGS. 2, 3, and 4, respectively.

In this example, sense amplifier 506 is coupled to a pair of complementary sense lines 505-1 ("D") and 505-2 ("D_"). As such, the sense amplifier 506 is coupled to all of the memory cells in a respective column through sense lines D and D_.

The sense amplifier 506 includes a pair of cross coupled n-channel transistors (e.g., NMOS transistors) 527-1 and 527-2 having their respective sources coupled to a negative control signal 528 (RNL_) and their drains coupled to sense lines D and D_, respectively. The sense amplifier 506 also includes a pair of cross coupled p-channel transistors (e.g., PMOS transistors) 529-1 and 529-2 having their respective sources coupled to a positive control signal 531 (PSA) and their drains coupled to sense lines D and D_, respectively.

The sense amplifier 506 includes a pair of isolation transistors 521-1 and 521-2 coupled to sense lines D and D_, respectively. The isolation transistors 521-1 and 521-2 are coupled to a control signal 522 (ISO) that, when activated, enables (e.g., turns on) the transistors 521-1 and 521-2 to connect the sense amplifier 506 to a column of memory cells. As illustrated in FIGS. 2 and 3, the sense amplifier 506 may be coupled to a first and a second memory array (e.g., sub-arrays) and can include another pair of isolation transistors coupled to a complementary control signal (e.g., ISO_), which is deactivated when ISO is deactivated such that the sense amplifier 506 is isolated from a first sub-array when sense amplifier 506 is coupled to a second sub-array, and vice versa. Also, as described above in association with FIGS. 2, 3, and 4, the sense amplifier 506 can be coupled to a number of other isolation devices located between the sense amplifier 506 and the corresponding sense lines D and D_, as well as a number of isolation devices located between the sense amplifier 506 and memory cells corresponding to a different (e.g., adjacent) sense amplifier.

The sense amplifier 506 also includes circuitry configured to equilibrate the sense lines D and D_. In this example, the equilibration circuitry comprises a transistor 524 having a first source/drain region coupled to an equilibration voltage 525 (dvc2), which can be equal to VDD/2, where VDD is a supply voltage associated with the array. A second source/drain region of transistor 524 is coupled to a common first source/drain region of a pair of transistors 523-1 and 523-2. The second source drain regions of transistors 523-1 and 523-2 are coupled to sense lines D and D_, respectively. The gates of transistors 524, 523-1, and 523-2 are coupled to control signal 526 (EQ). As such, activating EQ enables the transistors 524, 523-1, and 523-2, which effectively shorts sense line D to sense line D_ such that the sense lines D and D_ are equilibrated to equilibration voltage dvc2.

The sense amplifier 506 also includes transistors 532-1 and 532-2 whose gates are coupled to a signal 533 (COLDEC). Signal 533 may be referred to as a column decode signal or a column select signal. The sense lines D and D_ are connected to respective local I/O lines 534-1 (IO) and 534-2 (IO_) responsive to enabling signal 533 (e.g., to perform an operation such as a sense line access in association with a read operation). As such, signal 533 can be activated to transfer a signal corresponding to the data value (e.g., a logic data value such as logic 0 or logic 1) of the memory cell being accessed out of the array on the I/O lines 534-1 and 534-2.

In operation, when a memory cell is being sensed (e.g., read), the voltage on one of the sense lines D, D_ will be slightly greater than the voltage on the other one of sense lines D, D_. The PSA signal is then driven high and the RNL_ signal is driven low to activate the sense amplifier 506. The sense line D, D_ having the lower voltage will turn on one of the PMOS transistor 529-1, 529-2 to a greater extent than the other of PMOS transistor 529-1, 529-2, thereby driving high the sense line D, D_ having the higher voltage to a greater extent than the other sense line D, D_ is driven high. Similarly, the sense line D, D_ having the higher voltage will turn on one of the NMOS transistor 527-1, 527-2 to a greater extent than the other of the NMOS transistor 527-1, 527-2, thereby driving low the sense line D, D_ having the lower voltage to a greater extent than the other sense line D, D_ is driven low. As a result, after a short delay, the sense line D, D_ having the slightly greater voltage is driven to the voltage of the PSA signal (which can be the supply voltage VDD), and the other sense line D, D_ is driven to the voltage of the RNL_ signal (which can be a reference potential such as a ground potential). Therefore, the cross coupled NMOS transistors 527-1, 527-2 and PMOS transistors 529-1, 529-2 serve as a sense amp pair, which amplify the differential voltage on the sense lines D and D_ and serve to latch a data value sensed from the selected memory cell.

The present disclosure includes apparatuses and methods related to data shifting. An example apparatus comprises a first memory cell coupled to a first sense line of an array, a first isolation device located between the first memory cell and first sensing circuitry corresponding thereto, and a second isolation device located between the first memory cell and second sensing circuitry corresponding to a second sense line. The first and the second isolation devices are operated to shift data in the array without transferring the data via an input/output line of the array.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a processing resource; and
   a memory device coupled to the processing resource and comprising control logic and sensing circuitry configured to:
      parallel shift, in a first direction and at a same time, all data values stored in a group of memory cells coupled to a selected access line of an array such that the data values are stored in different respective memory cells of the selected access line subsequent to the parallel shift in the first direction; and
      parallel shift, in a second direction and at a same time, all data values stored in the group of memory cells such that the data values are stored in different respective memory cells of the selected access line subsequent to the parallel shift in the second direction; and
      wherein the parallel shift in the first direction and the parallel shift in the second direction are performed without transferring data from the array and/or sensing circuitry to the processing resource.

2. The system of claim 1, wherein the first direction is opposite the second direction.

3. The system of claim 1, wherein the group of memory cells coupled to the selected access line correspond to respective columns of the array each including a pair of complementary sense lines coupled to a respective sensing circuitry.

4. The system of claim 1, wherein each respective sensing circuitry comprises a sense amplifier latch and an accumulator latch.

5. The system of claim 1, wherein the control logic and sensing circuitry is configured to perform the parallel shift in the first direction by temporarily storing, in the sensing circuitry, the data values being shifted.

6. The system of claim 1, wherein the processing resource comprises one or more processors.

7. The system of claim 6, wherein the one or more processors are external to the memory device.

8. The system of claim 1, wherein the array is a dynamic random access memory (DRAM) array comprising one transistor one capacitor (1T1C) DRAM memory cells.

9. The system of claim 1, wherein the array comprises:
   a first memory cell coupled to a first sense line;
   a second memory cell coupled to a second sense line;
   a first device configured to selectively couple the first sense line to a first sensing circuitry responsive to a first control signal applied to the first device;
   a second device configured to selectively couple the first sense line to a second sensing circuitry responsive to a second control signal applied to the second device; and
   a third device configured to selectively couple the first sense line to a third sensing circuitry responsive to a third control signal applied to the third device; and
   wherein the control logic is configured to:
      control the first device and the second device via the first control signal and the second control signal to shift data in the first direction in the array; and
      control the first device and the third device via the first control signal and the third control signal to shift data in the second direction in the array.

10. A method of operating a system, the method comprising:
   responsive to first instructions received by a memory device from a processing resource, parallel shifting, in a first direction and at a same time, all data values stored in a group of memory cells coupled to a selected access line of an array of the memory device such that the data values are stored in different respective memory cells of the selected access line subsequent to the parallel shifting in the first direction; and
   responsive to second instructions received by the memory device from the processing resource, parallel shifting, in a second direction and at a same time, all data values stored in the group of memory cells such that the data values are stored in different respective memory cells of the selected access line subsequent to the parallel shifting in the second direction; and
   wherein the parallel shifting in the first direction and the parallel shifting in the second direction are performed without transferring data to the processing resource from the array and/or sensing circuitry coupled to the array.

11. The method of claim 10, wherein the memory device comprises control logic coupled to the array and to the sensing circuitry, and wherein the method includes receiving the first instructions and the second instructions at the control logic from the processing resource.

12. The method of claim 10, wherein the processing resource is an external host.

13. The method of claim 10, wherein the group of memory cells of the selected access line are coupled to respective sensing circuitries, and wherein performing the parallel shifting in at least one of the first direction and the second direction comprises:

enabling respective first devices coupled between the memory cells and respective sensing circuitries; and activating the respective sensing circuitries to store the respective data values in the respective sensing circuitries.

14. The method of claim 13, wherein performing the parallel shifting in at least one of the first direction and the second direction comprises: disabling the respective first devices coupled between the memory cells and the respective sensing circuitries to decouple corresponding sense lines from the respective sensing circuitries.

15. The method of claim 14, wherein the method further comprises:

to shift data in the first direction, activating the selected access line and enabling respective second devices coupled between the respective sensing circuitries and respective memory cells coupled to respective adjacent sense lines in the first direction; and to shift data in the second direction, activating the selected access line and enabling respective third devices coupled to respective adjacent sense lines in the second direction.

16. A system, comprising:

a processing resource; and a memory device coupled to the processing resource via a bus, wherein the memory device comprises:

an array of memory cells coupled to sensing circuitry; and control logic configured to provide control signals to the array and sensing circuitry to, responsive to instructions provided by the processing resource:

parallel shift, in a particular direction, all data values stored in a group of memory cells coupled to a selected access line to different respective memory cells of the selected access line;

wherein the parallel shift of the data values is performed without transferring data from the array and/or sensing circuitry to the processing resource.

17. The system of claim 16, wherein the particular direction includes a first direction along the selected access line and a second direction along the access line, and wherein the control logic is further configured to provide control signals to the array and sensing circuitry to:

parallel shift, in the first direction, all data values stored in the group of memory cells to different respective adjacent memory cells in the first direction; and parallel shift, in the second direction, all data values stored in the group of memory cells to different respective adjacent memory cells in the second direction.

18. The system of claim 16, wherein the array comprises:

a first device configured to selectively couple a first sense line to a first sensing circuitry responsive to a first control signal applied to the first device;

a second device configured to selectively couple the first sense line to a second sensing circuitry responsive to a second control signal applied to the second device; and a third device configured to selectively couple the first sense line to a third sensing circuitry responsive to a third control signal applied to the third device.

19. The system of claim 18, wherein the control logic is configured to:

control the first device and the second device via the first control signal and the second control signal to shift data in the first direction in the array; and control the first device and the third device via the first control signal and the third control signal to shift data in the second direction in the array.

20. The system of claim 19, wherein the control logic is configured to control shifting of data in the array by:

enabling the second device via the second control signal while disabling the first device via the first control signal in order to transfer a data value stored in a first memory cell coupled to a first sense line to the second sensing circuitry; and transferring the data value stored in the first memory cell to the second sensing circuitry without first storing the data value in the first sensing circuitry.

* * * * *